United States Patent
Epstein

(10) Patent No.: US 7,201,495 B2
(45) Date of Patent: Apr. 10, 2007

(54) SEMICONDUCTOR LIGHT EMITTING DEVICE PACKAGE WITH COVER WITH FLEXIBLE PORTION

(75) Inventor: Howard C. Epstein, Los Altos, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 106 days.

(21) Appl. No.: 10/911,443

(22) Filed: Aug. 3, 2004

(65) Prior Publication Data

US 2006/0028825 A1    Feb. 9, 2006

(51) Int. Cl.
*B60Q 1/14* (2006.01)

(52) U.S. Cl. .................. 362/278; 362/352; 257/98; 257/100

(58) Field of Classification Search ............... 362/278, 362/311, 352, 362; 257/98–100, 678; 160/10; 200/302.2
See application file for complete search history.

(56) References Cited

U.S. PATENT DOCUMENTS

| | | | |
|---|---|---|---|
| 1,265,386 A * | 5/1918 | Richards | 362/153.1 |
| 1,271,091 A * | 7/1918 | Sito | 362/352 |
| 2,777,942 A * | 1/1957 | Lester | 362/267 |
| 2,920,184 A * | 1/1960 | Kessler | 362/152 |
| 3,185,806 A * | 5/1965 | Bowman et al. | 200/302.2 |
| 3,805,347 A * | 4/1974 | Collins et al. | 257/99 |
| 4,574,338 A * | 3/1986 | Takasaki et al. | 362/278 |
| 5,136,475 A * | 8/1992 | McDermott | 362/158 |
| 5,825,054 A * | 10/1998 | Lee et al. | 257/98 |
| 5,985,696 A * | 11/1999 | Brunner et al. | 257/81 |
| 6,204,523 B1 | 3/2001 | Carey et al. | |
| 6,267,491 B1 * | 7/2001 | Parrigin | 362/153.1 |
| 6,274,924 B1 | 8/2001 | Carey et al. | |
| 6,897,486 B2 * | 5/2005 | Loh | 257/99 |
| 6,960,776 B2 * | 11/2005 | Machi | 250/504 R |

* cited by examiner

*Primary Examiner*—Sandra O'Shea
*Assistant Examiner*—Ismael Negron
(74) *Attorney, Agent, or Firm*—Patent Law Group LLP; Rachel V. Leiterman

(57) ABSTRACT

A packaged light emitting device includes a frame, a cover, and a light emitting device. The light emitting device is disposed between the cover and the frame. A portion of the cover is flexible and a portion of the cover is rigid. The cover includes a flange and is attached to the frame by positioning the rigid portion of the cover to maintain the flange in a nest formed in the frame. In some embodiments, a stake is disposed over the sunken surface that forms the nest in the frame, and the cover is held in place by positioning the flange between the sunken surface and the stake. In some embodiments, the flange is the same material as the flexible portion and the rigid portion is a ring that extends into the flange.

18 Claims, 3 Drawing Sheets

SEMICONDUCTOR LIGHT EMITTING DEVICE PACKAGE WITH COVER WITH FLEXIBLE PORTION

BACKGROUND

1. Field of Invention

The present invention relates to a package for a semiconductor light emitting device.

2. Description of Related Art

Semiconductor light emitting devices such as light emitting diodes (LEDs) are among the most efficient light sources currently available. Material systems currently of interest in the manufacture of high brightness, high power LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE), or other epitaxial techniques. The devices include an active, light emitting region sandwiched between an n-type region and a p-type region. Electrical contacts are provided on the n- and p-type regions.

FIG. 1 illustrates a package for an LED, described in more detail in U.S. Pat. Nos. 6,204,523 and 6,274,924. LED die 2 is enclosed in a package which generally includes a bed arrangement 3 upon which the LED die 2 rests, and an optically transmissive cover, generally including a lens. The bed arrangement 3 supports the LED die 2. The bed arrangement 3 includes a lower housing member 4 which has a die placement area 6. The die placement area 6 may be substantially flat, or may be configured as a receptacle. A reflective surface 8 may be provided on the die placement area 6, to direct emitted light outward. A substrate member 10 may be positioned inside the die placement area 6, to support the die 2 itself. The bed arrangement 3 also includes a lead support member 12, which is positioned over the lower housing member 4. Heavy leads 14, provided on the exterior of the package for incorporating the package into circuits and systems, are coupled through the lead support member 12 to fine leads (not shown), which couple directly to the LED die 2. The lead support member 12 includes an aperture 16, in which part of the lower housing is positioned. An optically transmissive cover 18 is positioned over the bed arrangement 3, to cover and protect the LED die 2 and its leads. The cover may be configured to operate as a lens to direct light in an application specific manner.

The cover 18 is made of one or more materials which are chosen for light-transmissive properties and for stability over the environmental conditions under which the LED is to operate. Conventionally, the optically transmissive cover 18 has been made of hard optical materials such as PMMA, glass, polycarbonate, optical nylon, transfer molded epoxy, cyclic olefin copolymer, rigid silicone, other optical plastics, glasses, or other transparent materials.

The design of FIG. 1 necessarily forms a cavity between cover 18 and LED die 2. The cavity sometimes contains air. This air-filled cavity creates one or more abrupt change in refractive index at the refractive index interfaces in the optical path; for example, at the interface between die 2 and the air in the cavity. These index steps tend to trap, deflect or refract, and scatter the light, reducing the percentage of the light generated within the LED chip that is extracted from the package.

SUMMARY

In accordance with embodiments of the invention, a packaged light emitting device includes a frame, a cover, and a light emitting device. The light emitting device is disposed between the cover and the frame. A portion of the cover is flexible and a portion of the cover is rigid. The cover includes a flange and is attached to the frame by positioning the rigid portion of the cover to maintain the flange in a nest formed in the frame. In some embodiments, a stake is disposed over the sunken surface that forms the nest in the frame, and the cover is held in place by positioning the flange between the sunken surface and the stake. In some embodiments, the flange is the same material as the flexible portion and the rigid portion is a ring that extends into the flange. Embodiments of the invention permit a rigid cover, as illustrated in FIG. 1, to be replaced with a flexible cover.

DETAILED DESCRIPTION

Figure 1:
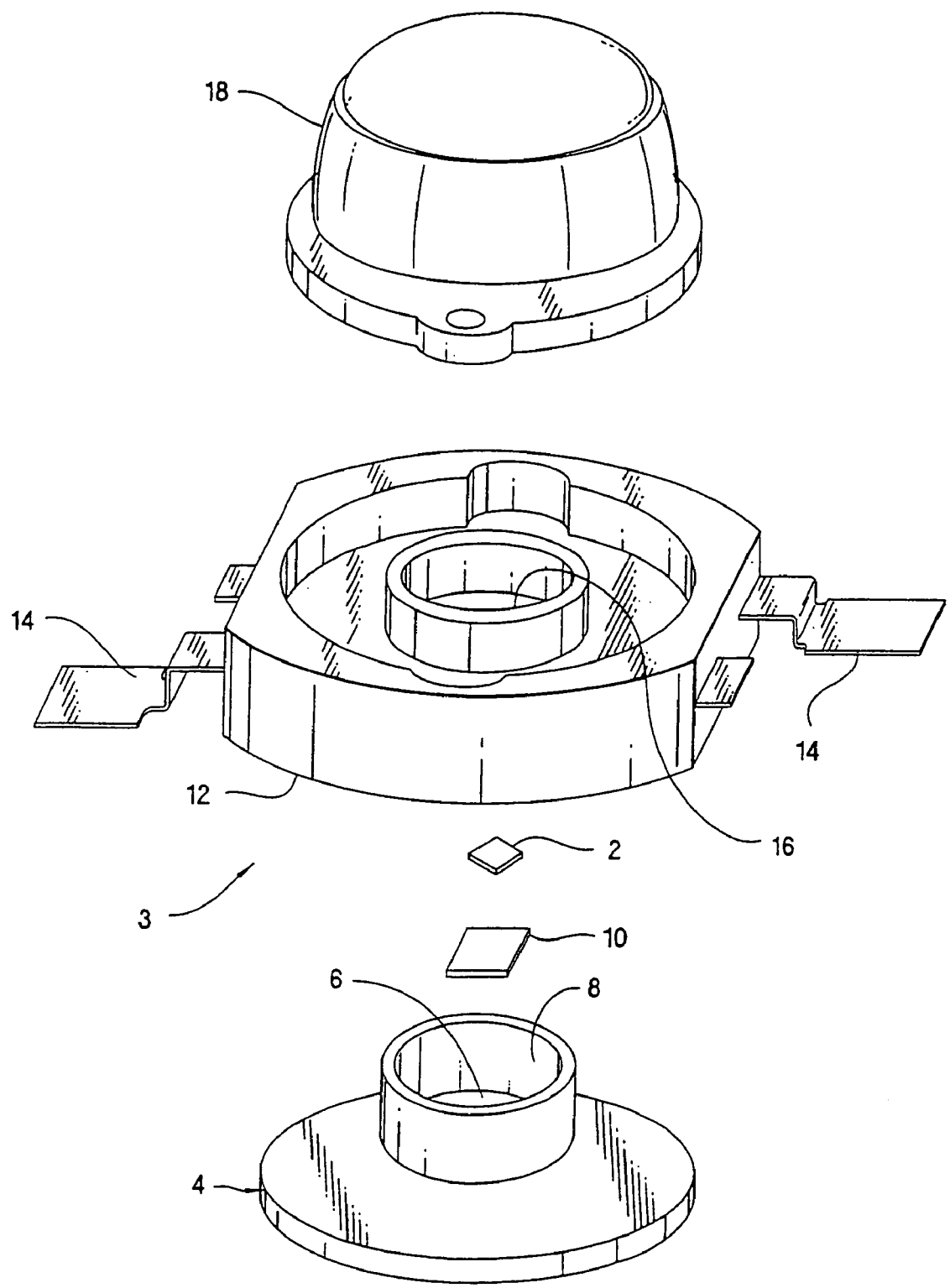
FIG. 1 illustrates a package for a semiconductor light emitting device.

Light extraction from the package of FIG. 1 may be improved by filling the cavity continuously within the optical path with a material that is index matched to die 2 and/or cover 18. Such index matching material is often very soft to avoid putting stress on the fine leads. The index matching material seals and protects the important surfaces of the semiconductor and optical cavity from environmental attack that may jeopardize the electrical operation of the semiconductor or efficient optical transmission through the optical path.

Filling the cavity of a device with a rigid shell generally requires a fill and vent channel that must later be sealed by some additional manufacturing process to retain and protect the material, such as by curing the injected encapsulant in place, by inserting a mechanical plug, by applying a compatible adhesive sealant, or by reforming package materials by processes such as ultrasonic welding or heat-welding. Such filling and sealing procedures may compromise part robustness and reduce yields due to the difficulty of forming a truly sealed cavity in this manner. In addition, it is difficult to form a truly sealed compartment with a rigid shell.

A flexible cover may form a better seal than a rigid shell. Also, a flexible cover permits the index matching material to expand and contract with changes in temperature without placing undue stress on the components in the compartment. Further, the use of a flexible cover may simplify the formation of a filled, sealed compartment, by permitting, for example, the injection of the filling material through the cover using a hypodermic needle. In embodiments of the invention, rigid cover 18 of the semiconductor light emitting device package of FIG. 1 is replaced by a flexible cover including a section of soft, elastomeric material. For example, the flexible cover may include a high durometer material with a hardness between about ShoreA 20 and about ShoreD 50. In some preferred embodiments, the elastomeric cover has a hardness of about ShoreA 70 or ShoreA 80. An example of a suitable elastomeric cover is a high durometer silicone rubber or similar material. The cover material may be selected to be durable and to tolerate light of the wavelength emitted by the light emitting device without degrading, for example, by yellowing.

Figure 2:
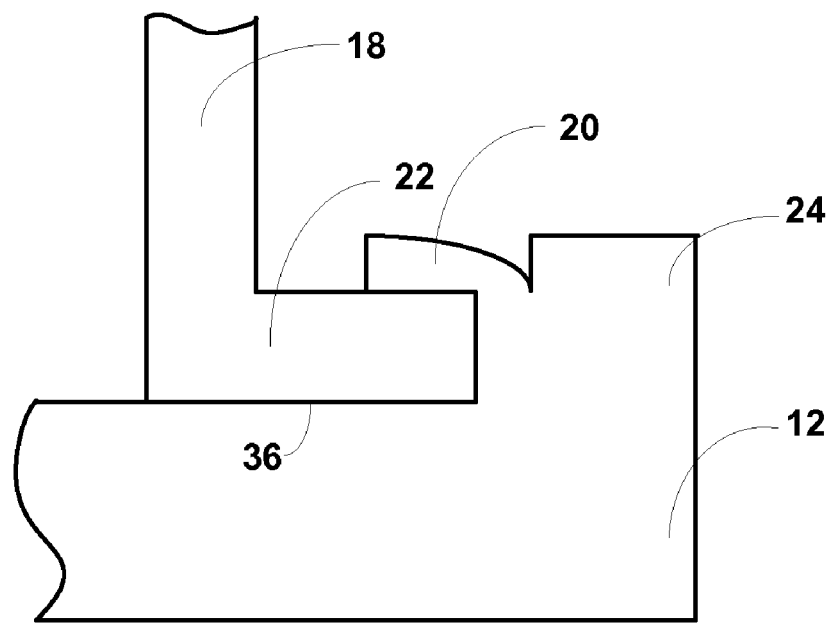
FIG. 2 is a cross section of a portion of a light emitting device package including a rigid cover.

FIG. 2 illustrates one method of attaching a rigid shell to a package. A portion of cover 18 and a portion of support member 12 are illustrated. At least a portion of support member 12 includes a surface 36 that is lower than the top surface of wall 24, such that surface 36 and wall 24 form a nest for cover 18. A foot or flange 22 included on at least a portion of cover 18 sits against wall 24, then a portion 20 of the wall (portion 20 is referred to as the "stake") is folded over, for example by heating stake 20 until it becomes pliable, then mechanically bending stake 20 over foot 22 to trap the foot of cover 18 in place between the floor of support member 12 and stake 20.

When flexible covers are attached to support member 12 as illustrated in FIG. 2, the cover may flex enough that the foot 22 can slip out from the area between support member 12 and stake 20, particularly when pressure is applied to the cover, for example by filling the cavity between the cover and support member 12, or during processes that require enough heat to cause the material filling the cavity to expand and to exert pressure on the cover.

Figure 3:
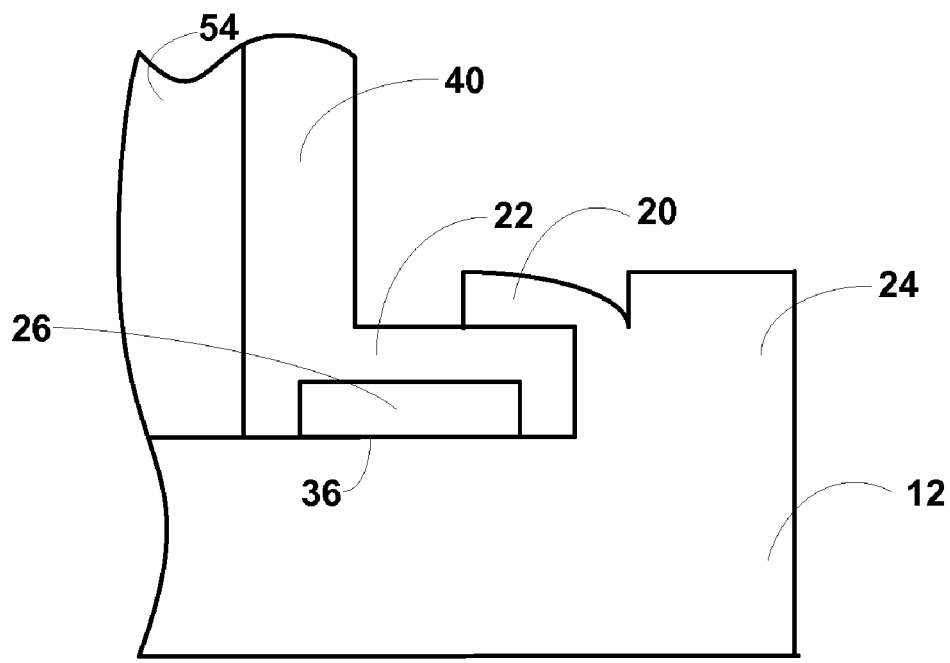
FIG. 3 is a cross section of a portion of a packaged light emitting device, according to embodiments of the invention.

FIG. 3 illustrates a device according to embodiments of the invention. The rigid cover 18 of FIG. 1 is replaced by a cover 40 that includes at least one flexible portion. Cover 40 may attached to support member 12 with a stake 20 as illustrated in FIG. 2. Cover 40 includes an integrated rigid member 26 that prevents foot 22 of cover 40 from escaping the region formed by wall 24 and stake 20, for example by pressing foot 22 against wall 24 or by preventing the region of cover 40 near foot 22 from flexing enough to free foot 22 from wall 24 and stake 20. In some embodiments, the entire cover except for rigid member 26 is formed from a flexible material. In other embodiments, portions of the cover besides rigid member 26 are rigid.

Figure 4:
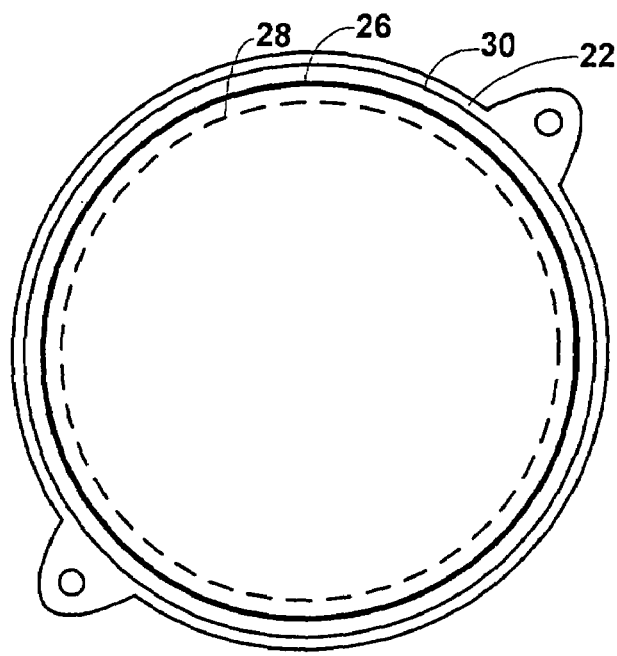
FIG. 4 is a plan view of the cover of FIG. 3.

FIG. 4 illustrates a top view of a flexible cover 40 including an integrated rigid support member 26 as illustrated in FIG. 3. In FIG. 4, foot 22 is formed along the entire edge of cover 40. In other embodiments, foot 22 may be formed on just a portion of the edge of cover 40. Circle 30 illustrates the inner border of foot 22, where cover 40 begins to rise vertically from support member 12. Dashed circle 28 illustrates the inner surface of cover 40 at the bottom of the cover. The surface formed by dashed circle 28 forms the top of the cavity in which the semiconductor light emitting device is disposed. Integrated rigid support member 26 is a ring in the device of FIG. 4. In some embodiments, rigid support member 26 may take other shapes, or may be formed only in parts of cover 40, such that it is not a continuous ring.

In some embodiments, rigid member 26 is wedged against wall 24 such that compression forces between rigid member 26 and wall 24 alone hold cover 40 in place, without the use of a stake 22 as illustrated in FIG. 3. In some embodiments, barbs or other features may protrude from rigid member 26 and dig into wall 24 to hold cover 40 in place without the use of stake 22.

Rigid member 26 may be formed within cover 40 as illustrated in FIG. 3, or may be attached to a surface of cover 40. In some embodiments, rigid member 26 may be separate from cover 40. For example, rigid member 26 may be separate from cover 40 and disposed on top of foot 20, between foot 20 and stake 22. Rigid member 26 may be any suitable rigid material. Examples of suitable materials include rigid plastics and metals such as stainless steel.

In some embodiments, rigid member 26 is wedged against wall 24 such that compression forces between rigid member 26 and wall 24 alone hold cover 40 in place, without the use of a stake 20 as illustrated in FIG. 3. In some embodiments, barbs or other features may protrude from rigid member 26 and dig into wall 24 to hold cover 40 in place without the use of stake 20.

Rigid member 26 may be formed within cover 40 as illustrated in FIG. 3, or may be attached to a surface of cover 40. In some embodiments, rigid member 26 may be separate from cover 40. For example, rigid member 26 may be separate from cover 40 and disposed on top of foot 22, between foot 22 and stake 20. Rigid member 26 may be any suitable rigid material. Examples of suitable materials include rigid plastics and metals such as stainless steel.

Figure 5:
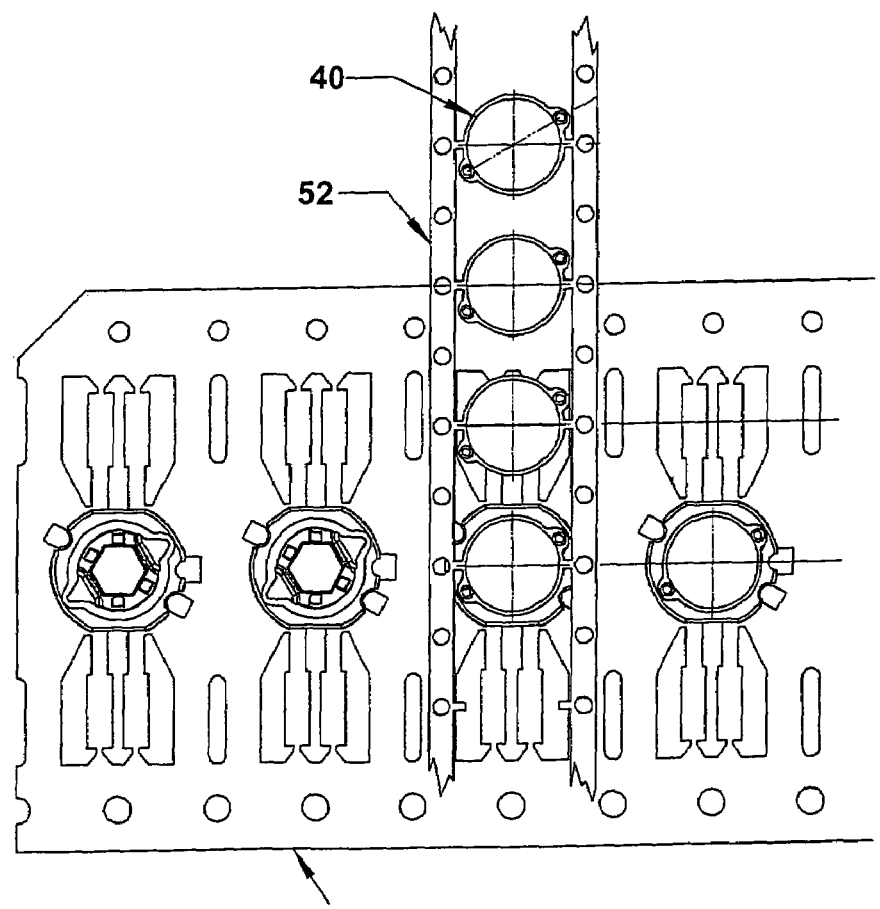
FIG. 5 illustrates a process of attaching a flexible cover to a frame.

In some embodiments, the rigid member facilitates handling the flexible cover, as illustrated in FIG. 5. In a preferred embodiment, the rigid members are rings formed in a sheet 52 such that each ring is connected to the sheet by one or more strips of rigid material. The covers 40, which in this example may be flexible, are then molded such that the rings are within the cover. As illustrated in FIG. 5, support members may also be formed in a sheet 50. The left side of FIG. 5 illustrates support members with a light emitting device attached, but no cover. The right side of FIG. 5 illustrates support members after cover 40 is attached. An individual cover is positioned over a support member 12 by moving the sheet 52 of flexible covers and/or the sheet 50 of support members. The cover is removed from sheet 52 by breaking the strips, then positioned in the nest of the support member and attached to support member 12 by heating and bending stake 20 over the foot 22 of the cover (FIG. 3). In this manner, the small individual flexible covers do not need to be handled, only a single, relatively rigid sheet of covers.

As described above, the cavity between cover 40 and support member 12 is filled with a softer material 54 (FIG. 3), generally silicone. The softer material may be a solid, such as a gel, or a liquid. In some embodiments, the softer material is optically transparent and non-scattering. In some embodiments, the softer material may contain a dissolved or suspended material such as an optical dye, phosphor, or other wavelength converting material, or a suspension of materials such as nano-particles or polymers with a different refractive index than the bulk softer material.

The indices of refraction of the cover and the softer material in the cavity may be selected to minimize Bragg reflection losses and waveguiding at the interfaces between the device and the softer material, and the softer material and the cover. For example, the softer material in the cavity may have an index of refraction equal to or between the indices of refraction of the cover and the light emitting device. The cover may have an index of refraction equal to or between the indices of refraction of the softer material in the cavity and the material outside the cover, typically air. For example, if the light emitting device is a III-nitride flip chip device grown on a sapphire substrate, light is extracted from the device through the sapphire substrate, which has an index of refraction of about 1.8. Assuming the packaged device is to be operated surrounded by air, which has an index of refraction of about 1, the softer material in the cavity may have an index of refraction ranging between about 1.8 and the index of refraction of the cover, which is usually less than the index of refraction of the extraction surface of the device, about 1.8 in this example. The cover may have an index of refraction ranging between the index of refraction of the softer material and about 1.

The use of a rigid support member 26, as illustrated in FIGS. 3 and 4 permits packaged semiconductor light emitting devices as illustrated in FIG. 1 to be manufactured with a flexible cover 40 replacing rigid cover 18. Since the cover is held in place by the rigid support member, the same shape cover may be used, permitting the device to be made using the same packaging equipment as may be used to form the rigid-cover device illustrated in FIG. 1.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is claimed is:

1. A structure comprising:
    a frame having a sunken surface that forms a nest;
    a cover comprising a flange;
    a cavity formed between the cover and the frame; and
    a light emitting device disposed between the cover and the frame; wherein:
        the light emitting device is disposed in a first portion of the cavity and a quantity of soft, solid material is disposed in a second portion of the cavity;
        the flange is positioned in the nest to connect the cover to the frame;
        the cover comprises a flexible portion and a rigid portion; and
        the rigid portion is positioned to maintain the flange in the nest.

2. The structure of claim 1 wherein the frame further comprises a stake disposed over the sunken surface, wherein the flange is disposed between the sunken surface and the stake.

3. The structure of claim 1 wherein the light emitting device is a semiconductor light emitting device.

4. The structure of claim 1 wherein the rigid portion is a rigid member disposed within the flexible portion of the cover.

5. The structure of claim 1 wherein the rigid portion is a rigid member disposed on a surface of the flexible portion of the cover.

6. The structure of claim 1 wherein the flexible portion comprises silicone.

7. The structure of claim 1 wherein:
    the flange is formed from the same material as the flexible portion; and
    the rigid portion is a ring disposed within the flange.

8. The structure of claim 1 wherein the rigid portion comprises plastic.

9. The structure of claim 1 wherein the rigid portion comprises metal.

10. The structure of claim 1 wherein the cover has a dome shape and the rigid portion is a ring disposed at a bottom of the dome.

11. The structure of claim 1 wherein the soft, solid material is softer than the flexible portion of the cover.

12. The structure of claim 1 further comprising leads electrically connected to the light emitting device and physically connected to the frame.

13. The structure of claim 1 wherein the flexible portion contacts the frame to form a sealed compartment between the cover and the frame.

14. A method comprising:
    providing a frame having a surface and a stake extending vertically from the surface;
    attaching a light emitting device to the frame;
    providing a cover having a flange, wherein a portion of the cover is flexible and a portion of the cover is rigid;
    positioning the cover such that an edge of the flange is disposed adjacent the stake; and
    folding at least a portion of the stake over the flange.

15. The method of claim 14 wherein the flange is formed of the same material as the flexible portion and the rigid portion is a ring disposed within the flange.

16. The method of claim 14 further comprising positioning the rigid member to maintain the flange between the stake and the surface.

17. A method comprising:
    forming a rigid ring connected to a sheet by a strip;
    forming a flexible cover attached to the ring;
    attaching a semiconductor light emitting device to a frame;
    positioning the cover over the frame;
    separating the cover from the sheet by breaking the strip;
    attaching the cover to the frame by disposing the cover in a nest in the frame and positioning the rigid ring to maintain the cover in the nest.

18. The method of claim 17 further comprising folding a stake attached to the frame over a flange on the cover.

* * * * *